US010522678B2

(12) United States Patent
Balakrishnan et al.

(10) Patent No.: US 10,522,678 B2
(45) Date of Patent: Dec. 31, 2019

(54) VERTICAL TRANSISTOR PASS GATE DEVICE

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/834,593

(22) Filed: Dec. 7, 2017

(65) Prior Publication Data

US 2018/0301555 A1    Oct. 18, 2018

Related U.S. Application Data

(63) Continuation of application No. 15/486,877, filed on Apr. 13, 2017, now Pat. No. 10,069,008.

(51) Int. Cl.
| | |
|---|---|
| *H01L 21/311* | (2006.01) |
| *H01L 29/78* | (2006.01) |
| *H01L 29/08* | (2006.01) |
| *H01L 29/06* | (2006.01) |
| *H01L 27/088* | (2006.01) |

(Continued)

(52) U.S. Cl.
CPC .... *H01L 29/7827* (2013.01); *H01L 21/31111* (2013.01); *H01L 27/088* (2013.01); *H01L 29/0692* (2013.01); *H01L 29/0847* (2013.01); *H01L 29/42376* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 9,368,512 B1 | | 6/2016 | Cheng et al. |
| 9,590,074 B1 | * | 3/2017 | Pranatharthiharan ....................... H01L 21/82387 |
| 10,069,008 B1 | | 9/2018 | Balakrishnan et al. |

(Continued)

OTHER PUBLICATIONS

Moroz, V. et al., "Modeling and Optimization of Group IV and III-V FinFETs and Nano-Wires" 2014 IEEE International Electron Devices Meeting (IEDM) (Dec. 2014) pp. 7.4.1-7.4.4.

(Continued)

*Primary Examiner* — Jay C Chang
(74) *Attorney, Agent, or Firm* — Tutunjian & Bitetto, P.C.; L. Jeffrey Kelly (57) ABSTRACT

A semiconductor device including a fin structure present on a supporting substrate to provide a vertically orientated channel region. A first source/drain region having a first epitaxial material with a diamond shaped geometry is present at first end of the fin structure that is present on the supporting substrate. A second source/drain region having a second epitaxial material with said diamond shaped geometry that is present at the second end of the fin structure. A same geometry for the first and second epitaxial material of the first and second source/drain regions provides a symmetrical device.

15 Claims, 6 Drawing Sheets

(51) Int. Cl.
*H01L 29/423* (2006.01)
*H01L 29/66* (2006.01)

(56) References Cited

U.S. PATENT DOCUMENTS

| | | | |
|---|---|---|---|
| 2008/0067613 A1* | 3/2008 | Anderson | H01L 29/41791 257/401 |
| 2015/0001593 A1 | 1/2015 | Kuo et al. | |
| 2015/0069526 A1* | 3/2015 | Basker | H01L 29/7856 257/401 |
| 2015/0072481 A1* | 3/2015 | Guo | H01L 29/786 438/151 |
| 2016/0293737 A1* | 10/2016 | Liu | H01L 29/66545 |

OTHER PUBLICATIONS

List of IBM Patents or Patent Applications Treated as Related dated Dec. 7, 2017, 2 pages.

\* cited by examiner

VERTICAL TRANSISTOR PASS GATE DEVICE

BACKGROUND

Technical Field

The methods and structures described herein relate to semiconductor devices, such as vertical transistors.

Description of the Related Art

A Field Effect Transistor (FET) typically has a source, a channel, and a drain, where current flows from the source to the drain, and a gate that controls the flow of current through the channel. With ever decreasing device dimensions, forming the individual electrical components is becoming more difficult to manufacture. Vertical transistors are one means of scaling transistors to decreasing dimensions. Integration of memory devices with increasingly scaled transistors, such as vertical transistors, creates additional challenges. An approach is therefore needed that retains the positive aspects of traditional FET structures and memory devices, while overcoming the scaling issues created by forming smaller device components.

SUMMARY

In one aspect, a vertically orientated pass gate transistor is provided including a fin structure to provide a vertically orientated channel and source and drain regions on opposite sides of the vertically orientated channel composed of diamond shaped epitaxial material having a geometry that provides a symmetrical device. In one embodiment, the pass gate transistor comprises a fin structure present on a supporting substrate to provide a vertically orientated channel region. A first source/drain region having a first epitaxial material with a diamond shaped geometry is present at first end of the fin structure that is present on the supporting substrate. A second source/drain region is having a second epitaxial material with said diamond shaped geometry is present at the second end of the fin structure, wherein a same geometry from the first and second epitaxial material of the first and second source/drain regions provides a symmetrical device.

In another embodiment, the pass gate transistor comprises a fin structure present on a supporting substrate to provide a vertically orientated channel region. A first source/drain region having a first epitaxial material with a diamond shaped geometry is present at first end of the fin structure that is present on the supporting substrate. A second source/drain region is having a second epitaxial material with said diamond shaped geometry is present at the second end of the fin structure, wherein a same geometry from the first and second epitaxial material of the first and second source/drain regions provides a symmetrical device. A gate structure is present around the vertically orientated channel region.

In another aspect, a method of forming a symmetrical pass gate transistor having a vertical channel orientation is provided. The method may include proving a fin structure on a supporting substrate. A sacrificial lateral dielectric layer may be formed on a first portion of the fin structure that provides a first source/drain region portion of the fin structure; and a gate structure may be formed atop the sacrificial lateral dielectric layer. A second epitaxial material having a diamond shaped geometry is formed on an exposed second portion of the fin structure for a second source/drain region. The sacrificial dielectric spacer layer is removed to expose the first portion of the fin structure; and a first epitaxial material is formed having the diamond shaped geometry on the first portion of the fin structure that is exposed. In some embodiments, a same geometry for the first and second epitaxial material of the first and second source/drain regions provides a symmetrical device.

BRIEF DESCRIPTION OF THE DRAWINGS

The following description will provide details of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Vertical transistors are an attractive option for technology scaling for 5 nm and beyond. Pass gates are needed for various analog, logic and memory applications, such as pass transistors in static random access memory (SRAM) cells, transmission gates, and analog to digital converters.

As will be discussed herein, vertical transistors may be employed as pass gate devices. In some examples, the vertical transistors may be vertical finFETs. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. The source and drain regions of the fin structure are the portions of the fin structure that are on opposing sides of the channel region of the fin structure.

A "gate structure" means a structure used to control output current (i.e., flow of carriers in the channel) of a semiconducting device through electrical or magnetic fields.

As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

In an embodiment, a finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

It has been determined that it can be advantageous in pass gates used in at least the aforementioned examples to have symmetrical performance, i.e., source-to-drain and drain-to-source symmetrical performance, because current flow and voltage bias can be in either direction. In some embodiments, structures and methods are described herein that provide a vertical transistor device where the top and bottom source/drain regions are both diamond shaped epitaxial structures having a low resistance making it a symmetrical vertical transistor structure. The pass gate vertical transistors described herein also provide reduced capacitance in the top source/drain contacts. The pass gate vertical transistors also provide a low resistance contact due to the increase amount of epitaxy. These features enable the design disclosed herein to provide efficient pass gate devices employing vertical transistor structures.

The methods and structures of the present disclosure are now described with greater detail with reference to FIGS. 1-10. In one embodiment, the pass gate transistor 100 comprises a fin structure 15 that is present on a supporting substrate 10 to provide a vertically orientated channel region. A first source/drain region 25a having a first epitaxial material with a diamond shaped geometry is present at first end of the fin structure 15 that is present on the supporting substrate 10. A second source/drain region 25a having a second epitaxial material with said diamond shaped geometry is present at the second end of the fin structure 15. The term "source/drain region" as used in the phrases "first source/drain region" and "second source/drain region" means that when the first source/drain region is a source region, the opposing second source/drain region is a drain region; and when the first source/drain region is a drain region, the opposing second source/drain region is a source region. It is noted that the first and second epitaxial material that provides at least a portion of the first source/drain region and the second source/drain region have a same geometry. By "same geometry" it is meant that the size of the first and second epitaxial semiconductor material, as well as the geometry of the first and second epitaxial from the first and second epitaxial material of the first and second source/drain regions provides a symmetrical device.

Figure 1A:
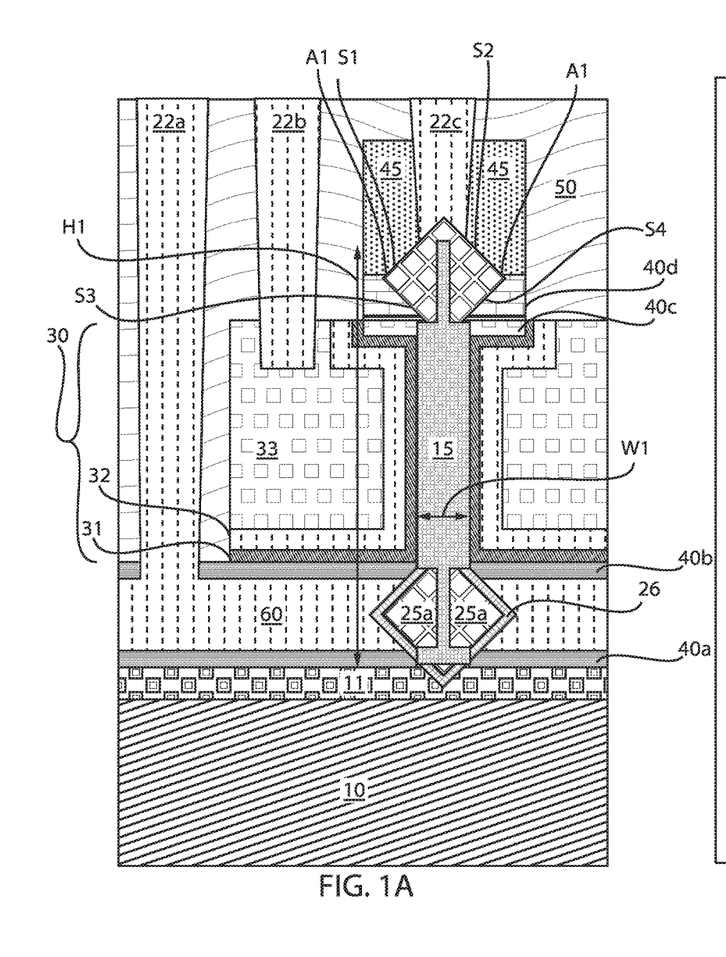
FIG. 1A is a side cross-sectional view of one embodiment of a symmetrical pass gate transistor including a vertically orientated channel within a fin structure.
Figure 1B:
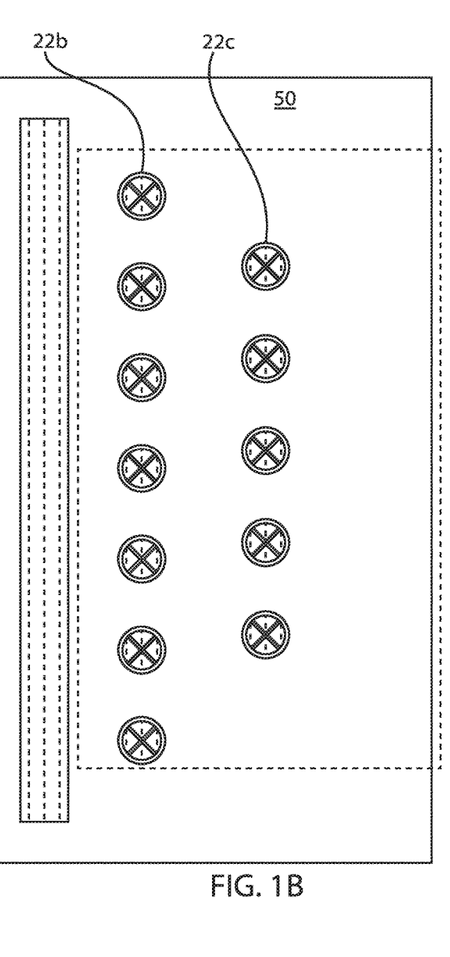
FIG. 1B is a top down view of the symmetrical pass gate transistor including the vertically orientated channel that is depicted in FIG. 1A along section line A-A of FIG. 1B.

By "diamond shaped geometry" it is meant that when viewed from the side cross section, along section line A-A as depicted in FIGS. 1A and 1B, the epitaxial semiconductor material has a substantially triangular geometry on each side of the fin structure, wherein the apex for the triangular geometry on each side of the fin structure is in substantially in the middle of the triangular geometry. Taking the two triangular geometries that combine to provide the diamond shaped geometry together, the distance from apex to apex provides the greatest width of the diamond shaped geometry for the first and second epitaxial material.

FIGS. 1A-1B illustrate one embodiment of a vertically orientated pass through gate transistor 100 that includes a fin semiconductor structure 15 that is present atop a supporting substrate 10. The fin semiconductor structure 15 may have a width W1 of less than 15 nm. In some embodiments, the fin semiconductor structure 15 may have a width W1 ranging from 5 nm to 10 nm. In one example, the fin semiconductor structure 15 will have a width W1 that is equal to 8 nm. It is noted that the above examples for the width W1 of the fin semiconductor structure 15 is provided for illustrative purposes only, and is not intended to limit the present disclosure. For example, the width W1 of the fin semiconductor structure 15 that provides the base region for the vertically orientated pass through gate transistor 100 described herein may be equal to 5 nm, 6 nm, 7 nm, 8 nm, 9 nm, 10 nm, 11 nm, 12 nm, 13 nm, 14 nm, and 15 nm, as well as any range of widths W1 having an upper value for the range selected from one of the aforementioned examples, and a lower value for the range selected from one of the aforementioned examples. The width W1 of the semiconductor fin structure 15 is substantially uniform along its entire height. This means that the width W1 of the semiconductor fin structure 15 at the top of the fin structure 15 is substantially the same, e.g., within +/−5%, of the width W1 of the semiconductor fin structure 15 at the base of the semiconductor fin structure 15. The width of the central, i.e., half the height, of the fin structure 15 is also the same as the width at the base and upper surfaces, as well as the width at the points therebetween.

The semiconductor fin structure 15 can be composed of semiconductor material, e.g., type IV or type III-V semiconductor material. Examples of type IV semiconductor materials for the semiconductor fin structure 15 include silicon (Si), germanium (Ge) and silicon germanium (Ge). The semiconductor fin structure 15 may also be composed of indium phosphide (InP) or indium phosphide (InP) on silicon (Si). Other III-V semiconductor materials that can provide the semiconductor substrate may include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof.

The semiconductor fin structure 15 that provides the vertically orientated channel is typically composed of a crystalline material. For example, the semiconductor fin structure 15 is typically a single crystal material (also referred to as monocrystalline material). The term "single crystalline" denotes a crystalline solid, in which the crystal lattice of the entire sample is substantially continuous and substantially unbroken to the edges of the sample, with substantially no grain boundaries.

Still referring to FIGS. 1A-1B, the first source/drain region 25a and the second source/drain region 25b are present on opposing sides of the channel region portion of the fin structure. In the embodiment that is depicted in FIGS. 1A and 1B, the first source/drain region 25a is a source region, and the second source/drain region 25b is a drain region. In other embodiments, the first source/drain region 25a may be a drain region, and the second source/drain region 25b may be a source region.

The first source/drain region 25a and the second source/drain region 25b can be epitaxially formed semiconductor materials in an epitaxial relationship with the semiconductor fin structure 15 that provides the base region. The term "epitaxial" denotes that a material is formed using an epitaxial growth process. The terms "epitaxial growth and/or deposition" and "epitaxially formed" mean the growth of a material, such as a semiconductor or dielectric, on a deposition surface of a semiconductor material, in which the material being grown has the same crystalline characteristics, e.g., crystalline plane orientation, as the semiconductor material of the deposition surface. For example, the first source/drain region 25a and the second source/drain region 25b may have the same orientation crystal plane as the semiconductor fin structure 15. For example, both the semiconductor fin structure 15 and the first source/drain region 25a and the second source/drain region 25b may have the orientation of a (100) crystal plane. In other embodiments, both the semiconductor fin structure 15, and the first source/drain region 25a and the second source/drain region 25b may have the orientation of a (110) crystal plane.

In some embodiments, the semiconductor material for the first source/drain region 25a and the second source/drain region 25b of the device may be the same composition as the composition of the semiconductor material that provides the semiconductor fin structure 15 that provides the channel region of the device. In other embodiments, the semiconductor material for the emit first source/drain region 25a and the second source/drain region 25b of the device may be a different composition from the composition of the semiconductor material that provides the semiconductor fin structure 15 that provides the base region of the device. For example, the materials for the semiconductor fin structure 25 may include silicon (Si), germanium (Ge), silicon germanium (Ge), indium phosphide (InP), aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof.

The conductivity type of the first and second source/drain region dictates the conductivity type of the device, e.g., whether the pass gate transistor is an n-type or p-type device. The term "conductivity type" means that a region is either doped to an n-type conductivity or a p-type conductivity. For example, when the first and second source/drain region 25a, 25b are doped to an n-type conductivity region, the pass gate transistor is an n-type device, and when the first and second source/drain regions 25a, 25b are doped to a p-type conductivity, the pass gate transistor is a p-type device.

As noted above, the epitaxial semiconductor material that is formed on the source and drain portions of the fin structure 15 to provide the first and second source/drain regions 25a, 25b has a diamond like geometry. The diamond like geometry of the epitaxial semiconductor material will have a peaked sidewall or a sidewall having a first apex A1 on each sidewall of the epitaxial semiconductor material. The sidewalls S1, S2, S3, S4 extending to and from the apexes A1 are substantially planar, i.e., are without significant curvature. In some embodiments, each sidewall of the epitaxial semiconductor material that provides the first and second source/drain regions 25a, 25b that are present on opposing sidewalls of the fin structures 5 will have a single apex A1 positioned approximately at half the height of the epitaxial semiconductor material.

It is noted that to provide a symmetrical device, the geometry of the first source/drain region 25a may be identical to the second source/drain region 25b. Further, the dimensions of the first source/drain region 25a may be substantially the same as the second source/drain region 25b. The composition, i.e., base composition, e.g., silicon, and the concentration of the dopant, e.g., n-type or p-type dopant, that dictates the conductivity type of the first source/drain region 25a is typically the same as the base composition and dopant concentration of the second source/drain region 25b.

Still referring to FIGS. 1A and 1B, an epitaxial contact 45 is formed in direct contact with the second source/drain region 25b. The epitaxial contact 45 is typically formed of a silicon or germanium containing semiconductor material, such as silicon, single crystal silicon, polycrystalline silicon, polycrystalline germanium, polycrystalline silicon germanium, single crystal germanium, single crystal silicon germanium and combinations thereof. The epitaxial contact 45 is typically doped to a same conductivity type as the second source/drain region 25b. For example, if the second source/drain region 25b is doped to an n-type conductivity, the extrinsic contact 45 is also doped to an n-type conductivity.

Referring to FIGS. 1A and 1B, the vertically orientated pass through gate transistor 100 may further include spacers

40a, 40b, 40c, 40d of a dielectric material, such as an oxide, nitride, oxynitride material or low-k dielectric material. The first spacer layer 40a separates the lateral through contact 60 that extends to the first source/drain region 25a from the supporting substrate 10 and the counter doped region 11. The second spacer layer 40b separates the lateral through contact 60 from the gate structure 30. The third and fourth spacer layers 40c, 40d separate the second source/drain region 25b from the gate structure 30. Examples of materials suitable for low-k dielectric spacers 40 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The vertically orientated pass through gate transistor 100 that is depicted in FIGS. 1A-1B may be present on a supporting substrate 10 composed of a type III-V semiconductor material or type IV semiconductor material. The supporting substrate 10 is typically composed of a single crystalline material. In some embodiments, when the fin structure 15 is formed from the upper semiconductor layer of an SOI substrate, a buried oxide layer may separate the semiconductor fin structure 25 from the semiconductor substrate 10.

A counter doped layer 11 may be present atop the supporting substrate 10, in which the counter doped layer 11 separates supporting substrate 10 from the fin structure 15. The counter doped layer 11 typically provides a punch through stop (PTS) region. The term "counter doped" means that the counter doped layer 11 has an opposite conductivity type as the first source/drain region 25a. For example, when the first source/drain region 25a has an n-type conductivity, the counter doped region 15a has a p-type conductivity.

The lateral contact 60 to the first source/drain region 25a is present atop the counter doped layer 11. The lateral contact 60 extends horizontally across and upper surface of the counter doped layer 11 to provide electrical communication between a via contact 22a and the first source/drain region 25a. The lateral contact 60 is typically composed of a metal, such as copper (Cu), tungsten (W), aluminum (Al), tantalum (Ta), platinum (Pt), silver (Ag), gold (Au), titanium (Ti), and combinations thereof. Similarly, the via contact 23 may also be composed of a metal, such as copper (Cu), tungsten (W), aluminum (Al), tantalum (Ta), platinum (Pt), silver (Ag), gold (Au), titanium (Ti), and combinations thereof. The via contact 22a extends vertically though an interlevel dielectric 50. In the embodiment depicted in FIG. 1, in which the first source/drain region 25a is a source region, and the second source/drain region 25b is a drain region, the via contact 23 may be referred to as a source via contact. The vertically orientated pass through gate transistor 100 may also include a drain via contact 22c that is in electrical communication with the second source/drain region 25b.

In some embodiments, a metal semiconductor alloy layer 26 may be present on the outer surfaces of the first source/drain region 25, the metal semiconductor alloy layer 26 being present between the lateral contact 60 and the first source/drain region 25a. The metal semiconductor alloy layer 26 may be provided by a silicide material.

Still referring to FIGS. 1A and 1B, the channel region of the fin structure 15 is in direct contact with a gate structure 30. The gate structure 30 includes a gate dielectric 31, a work function metal adjusting layer 32 and a gate electrode 33. The gate dielectric 31 may be composed of any dielectric material, such as an oxide, nitride or oxynitride material. In some embodiments, the gate dielectric 31 is a high-k dielectric material. As used herein, "high-k" denotes a dielectric material featuring a dielectric constant (k) higher than the dielectric constant of $SiO_2$ at room temperature. For example, the gate dielectric layer 31 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 31 include hafnium silicate, hafnium silicon oxynitride or combinations thereof. In one embodiment, the gate dielectric 31 has a thickness ranging from about 1.0 nm to about 6.0 nm.

The work function metal adjusting layer 32 may be a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

The gate electrode 32 may be composed of a doped semiconductor that is electrically conductive, such as n-type doped polysilicon, or the gate electrode 32 may be composed of a metal, such as copper (Cu), tungsten (W), aluminum (Al), tantalum (Ta), platinum (Pt), silver (Ag), gold (Au), titanium (Ti), and combinations thereof.

The vertically orientated pass through gate transistor 100 may also include a gate via contact 22b.

Figure 2:
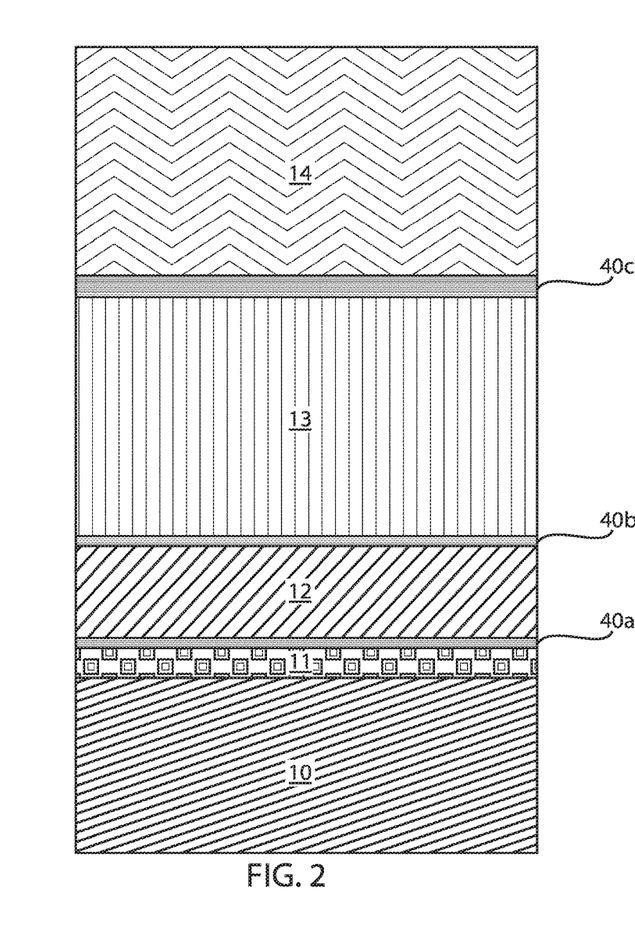
FIG. 2 is a side cross-sectional view of one embodiment of a material stack formed atop a supporting substrate for providing the symmetrical pass gate transistor including the vertically orientated channel.

FIGS. 2-10 depict one embodiment of a method for forming the vertically orientated pass through gate transistor 100 depicted in FIGS. 1A-1B. FIG. 2 depicts one embodiment of a material stack formed atop a supporting substrate 10 for providing the symmetrical pass gate transistor 100 including the vertically orientated channel 15. In some embodiments, the initial material stack begins with a counter doped layer 11 that is present atop the supporting substrate 10. The supporting substrate 10 has been described above with reference to FIGS. 1A and 1B. The counter doped layer 11 may be formed on the upper surface of the supporting substrate 10 by ion implantation into the upper surface of the supporting substrate 10 or by epitaxial growth in combination with in situ doping or ion implantation. The counter doped layer 11 may be composed of a type IV or a type III-V semiconductor material. The counter doped layer 11 may have an n-type or p-type conductivity, i.e., having the conductivity type opposite the later formed first source/drain region 15a. The counter doped layer 11 may have a thickness ranging from 5 nm to 50 nm.

In some embodiments, the material stack may further include a first dielectric spacer layer 40a, a sacrificial lateral dielectric layer 12, a second dielectric spacer layer 40b, a sacrificial gate structure layer 13, a third dielectric spacer layer 40C and a cap dielectric layer 14. Each of the aforementioned layers may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

The first dielectric spacer layer 40A is present directly on the counter doped layer 11, and may be composed of any dielectric material, and in some instances may be composed of silicon oxide or silicon nitride. In some embodiments, the first dielectric spacer layer 40A can be composed of a low-k material. As used herein, the term "low-k" denotes a dielectric material having a dielectric constant equal to the dielectric constant of silicon oxide ($SiO_2$) or less. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The thickness of the first dielectric spacer layer 40A may range from 5 nm to 20 nm.

The sacrificial lateral dielectric layer 12 is formed directly on the first dielectric spacer layer 40a. The sacrificial lateral dielectric layer 12 may be composed of dielectric materials that are suitable to the above described first dielectric spacer layer 40a, but typically the composition of the sacrificial lateral dielectric layer 12 is to be removed using an etch that is selective to the first dielectric spacer layer 40a, as well as the second dielectric spacer layer 40b and the subsequently formed semiconductor fin structure 15. For example, when the first dielectric spacer layer 40a is composed of an oxide, e.g., silicon oxide, the sacrificial lateral dielectric layer 12 may be composed of a nitride, e.g., silicon nitride. It is noted that this example is provided for illustrative purposes only and is not intended to limit the present disclosure. Any of the aforementioned dielectric compositions for the first dielectric spacer layer 40A may provide the composition for the sacrificial lateral dielectric, so long as the combination of materials selected for the sacrificial lateral dielectric layer 12, the first dielectric spacer layer 40a, the second dielectric spacer layer 40b, and the semiconductor fin structure 15 allow for the selective removal of the sacrificial lateral dielectric layer 12. The thickness of the sacrificial dielectric layer 12 may range from 100 nm to 800 nm. In some embodiments, the thickness of the sacrificial lateral dielectric layer 12 may range from 250 nm to 500 nm.

The second dielectric spacer layer 40b is present directly on the sacrificial lateral dielectric layer 12. The second dielectric spacer layer 40b is similar to the first dielectric spacer layer 40a. Therefore, the above description of the first dielectric spacer layer 40a is suitable for describing the second dielectric spacer layer 40b. For example, the second dielectric spacer 40b of silicon oxide or silicon nitride. In some embodiments, the composition of the second dielectric spacer 40b is selected so that the sacrificial lateral dielectric layer 12 may be removed using an etch that does not remove the second dielectric spacer 40b.

The sacrificial gate structure layer 13 is formed in direct contact with the second dielectric spacer layer 40b. The sacrificial gate structure layer 13 may be composed of any material that can be removed selectively to the first dielectric spacer layer 40a. In some embodiments, the sacrificial gate structure layer 13 be composed of a silicon containing material, such as amorphous silicon ($\alpha$-Si).

The third dielectric spacer layer 40c is present directly on the sacrificial gate structure layer 13. The third dielectric spacer layer 40c is similar to the first dielectric spacer layer 40a. Therefore, the above description of the first dielectric spacer layer 40a is suitable for describing the third dielectric spacer layer 40c. For example, the third dielectric spacer 40c can be composed of silicon oxide or silicon nitride.

The cap dielectric layer 14 in some examples may be composed of an oxide, such as silicon oxide. The selection of the composition of the cap dielectric layer 14 and the third dielectric spacer layer 40c can be selected to provide that the cap dielectric layer 14 can be removed by an etch process that is selective to the third dielectric spacer layer 40c. The sacrificial spacer layer 51 protects the sacrificial gate structure layer 13 from being etched by the process steps that remove the cap dielectric layer 14. The thickness of the cap dielectric layer 14 is selected to provide a portion of the fin structures for forming the second source/drain region 25b.

Figure 3:
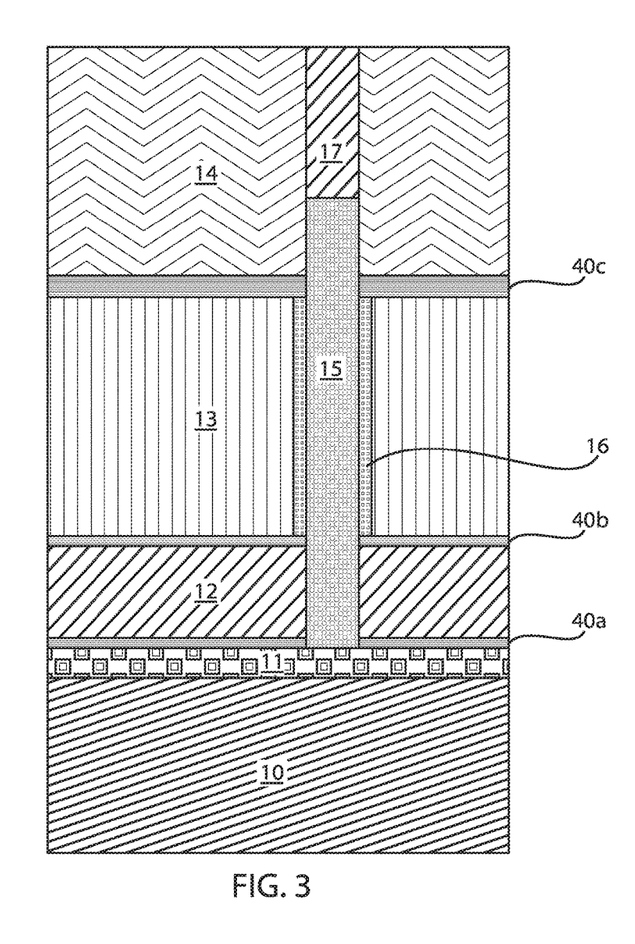
FIG. 3 is a side cross-sectional view depicting forming a fin opening the material stack depicted in FIG. 2, and epitaxially forming a fin structure for the vertically orientated channel of the device.

FIG. 3 depicts forming a fin structure 15 for the vertically orientated channel of the pass gate transistor. In some embodiments, forming the fin structures 15 may begin with forming fin structure openings through the material stack. The fin structure openings are formed using deposition, photolithography and etch processes. First, an etch mask is formed atop the material stack having openings exposing the portions of the material stack, in which the fin structure openings are formed. Specifically, a etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions.

In some embodiments, the etch process may be an anisotropic etch that removes the exposed portions of the dielectric cap layer 14, the third dielectric spacer layer 40c, the sacrificial gate structure layer 13, the second dielectric spacer layer 40b, the sacrificial lateral dielectric layer 12 and the first dielectric spacer layer 40a. In some embodiments, the etch process for forming the fin structure openings may be selective to the material of the counter doped layer 11. For example, the etch process for forming the fin structure openings can be a reactive ion etch process.

Still referring to FIG. 3, following the formation of the fin structure openings, a thermal oxidation process forms a dielectric surface 16 of the sidewall surface of the sacrificial gate structure layer 13 that are exposed within the fin structure openings. In the embodiments in which the sacrificial gate structure layer 13 is composed of a silicon containing material, the dielectric surface 16 may be composed of an oxide, such as silicon oxide.

In a following process step, the fin structures 15 are formed filling the fin structure openings using an epitaxial deposition process that employs the exposed surface of the counter doped layer 11 at the base of the fin structure openings as an epitaxial deposition growth surface. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxially formed fin structure 15 can be a type IV semiconductor containing material layer. For example, the epitaxially formed semiconductor fin structure 15 may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. In some embodiments, the gas source for the deposition of an epitaxially formed semiconductor fin structure 15 may include silicon (Si) deposited from silane, disilane, trisilane, tetrasilane, hexachlorodisilane, tetrachlorosilane, dichlorosilane, trichlorosilane, disilane and combinations thereof. The temperature for epitaxial silicon germanium deposition typically ranges from 450° C. to 900° C. Although higher temperature typically results in faster deposition, the faster deposition may result in crystal defects and film cracking. In other embodiments, the epitaxially formed fin structures 15 may be composed of a type III-V semiconductor material.

The epitaxial semiconductor material that provides the fin structure 15 does not form on dielectric surfaces, such as the dielectric cap layer 14 or the dielectric surface 16 of the sacrificial gate structure layer 13. The geometry and composition of the fin structures 13 that are formed in FIG. 3 have been described in greater detail with reference to FIGS. 1A and 1B.

FIG. 3 further depicts recessing the epitaxially formed semiconductor fin structure 15, and forming a dielectric cap 17 on the recessed surfaces of the fin structure 15. The semiconductor fin structure 15 may be recessed using an etch that is selective to the cap dielectric layer 14. Etching the epitaxially formed fin structure 15 forms a recess in the upper portion of the fin structure opening. The recess is filled with a deposited dielectric material to provide the dielectric cap 17. In some embodiments, the dielectric cap 17 may be composed of a nitride, such as silicon nitride, that is deposited using chemical vapor deposition (CVD), such as plasma enhanced chemical vapor deposition (PECVD).

Figure 4:
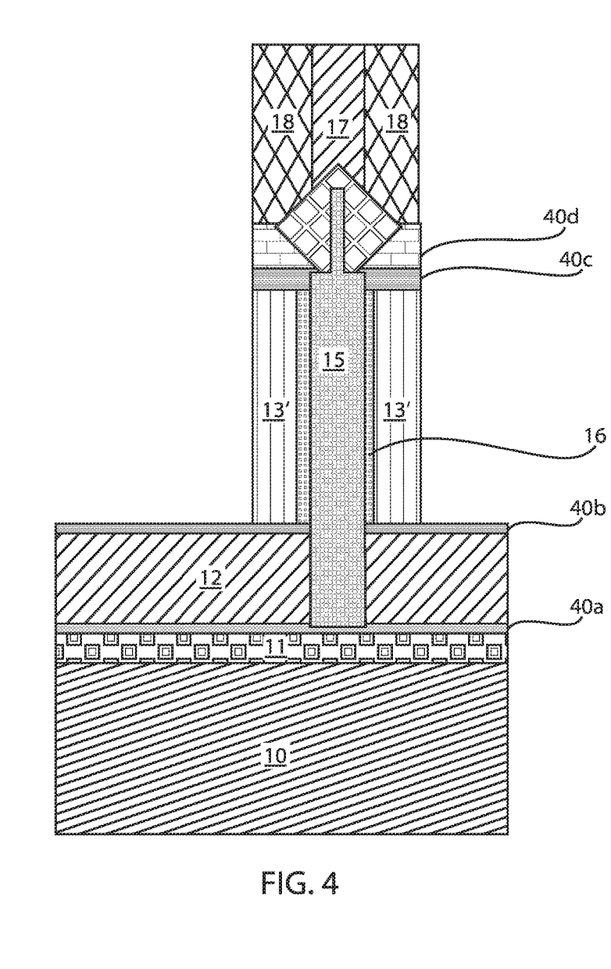
FIG. 4 is a side cross-sectional view depicting forming the second source/drain region of the device, in accordance with one embodiment of the present disclosure.

FIG. 4 depicts one embodiment of forming the second source/drain region 25b of the device. In some embodiments, forming the second source/drain region 25b may begin with removing the cap dielectric layer 14 with an etch process, such as an etch process that is selective to the third dielectric spacer layer 40c. Removing the cap dielectric layer 14 exposes upper sidewalls of the fin structures 15.

FIG. 4 depicts one embodiment of epitaxially forming the epitaxial semiconductor material for the second source/drain region 25b directly on the exposed upper sidewall surfaces of the fin structure, in which the epitaxial semiconductor material has a diamond geometry. The diamond like geometry of the epitaxial semiconductor material for the second source/drain regions 25b depicted in FIG. 4 have a peaked sidewall or a sidewall having a first apex A1 on each sidewall of the epitaxial semiconductor material.

In some embodiments, the epitaxial semiconductor material for the second source/drain region 25b may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The epitaxial semiconductor material for the second source/drain region 25b is grown using an epitaxial growth or deposition process that may be a selective deposition process. For example, although the epitaxially semiconductor material for the second source/drain region 25b orientates to the crystal arrangement of a semiconductor material, the material may not be deposited on the dielectric material of the dielectric cap 17 and the third dielectric spacer layer 40c.

The epitaxial deposition process described above for forming the fin structures 15 is suitable for providing more details for the epitaxial deposition process for forming the epitaxial semiconductor material for the second source/drain region 25b, such as gas precursors and deposition temperatures.

The epitaxial semiconductor material for the second source/drain region 25b may terminate, e.g., self-terminate, along the (111) plane. In some embodiments, to provide diamond shape geometry for the epitaxial semiconductor material for the second source/drain region 25b (as well as first source/drain region 25a) with {111} facets, all material surfaces should be {100} and the sidewalls of the fin structure 15 should have {110} planes.

The conductivity type of the source and the drain regions typically dictates the conductivity type of the semiconductor device. In the embodiments in which the device being formed has n-type source and drain regions, the device may be an n-type pass gate transistor 100; and when the device has p-type source and drain regions, the device may be a p-type pass gate transistor 100. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous. The dopant for the epitaxial semiconductor material that dictates the conductivity type of the second source/drain region 25b is typically present in a concentration ranging from $1 \times 10^{17}$ atoms/cm$^3$ to $5 \times 10^{19}$ atoms/cm$^3$.

The dopant for the epitaxial semiconductor material for the second source/drain region 25b may be introduced to the semiconductor material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source may include diborane ($B_2H_6$).

In some embodiments, the epitaxial semiconductor material for the second source/drain region 25b may be formed using a low temperature epitaxial growth process. The term "low temperature" when used to describe the epitaxial deposition process denotes that the maximum temperature of the epitaxial deposition process for forming the epitaxial semiconductor material, such as the second source/drain region 25b, is 350° C. In some embodiments, the temperature of the low-temperature deposition process provided herein may range from 135° C. to 350° C. In some other embodiments, the temperature of the low-temperature deposition process may range from 150° C. to 225° C. In some other embodiments, the temperature of the low temperature deposition process may range from 175° C. to 200° C. It is noted that the aforementioned ranges of temperature is provided for illustrative purposes only. Other examples of temperatures at which the epitaxial material may be formed using low temperature processing may be equal to 140° C., 150° C., 160° C., 170° C., 180° C., 190° C., 200° C., 210° C., 220° C., 230° C., 240° C., 250° C., 260° C., 270° C., 280° C., 290° C., 300° C., 310° C., 320° C., 330° C., 340° C., and 350° C., as well as any range having an lower endpoint value provided by one of aforementioned examples, and having an upper endpoint value provided by one of aforementioned examples.

Epitaxial growth at low temperature can be obtained by increasing and optimizing the hydrogen gas to silane [H2]/[SiH4] gas ratio. In one embodiment, the selective epitaxial growth of silicon (Si) is performed in a hydrogen (H2) diluted silane environment using a plasma enhanced chemical vapor deposition process (PECVD). In particularly useful embodiments, epitaxially growth of silicon begins at a gas ratio of about 5-10. The epitaxial Si quality is improved by increasing the hydrogen dilution, e.g., to 5 or greater.

In one embodiment, the epitaxial semiconductor material for the second source/drain region 25b is composed of silicon that is n-type doped, e.g., monocrystalline silicon that is n-type doped. In one embodiment, the method of selective epitaxial growth of highly-doped silicon at temperatures as low as 150° C. may employ plasma enhanced chemical vapor deposition (PECVD). Silane ($SiH_4$) is only one example of a deposition gas suitable for use with low temperature epitaxial growth. Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces are produced (epitaxial silicon to crystalline silicon) and fewer stacking faults and other defects were observed.

Although plasma enhanced chemical vapor deposition (PECVD) is one apparatus suitable for providing low temperature epitaxial growth in accordance with the presently described methods and structures, in some other embodiments, to provide the low temperature epitaxial growth process, radio-frequency (RF) or direct current (DC) plasma enhanced chemical vapor deposition (CVD) is performed at deposition temperature ranges from about room temperature to about 500° C., and in some instances from about 150° C. to about 250° C.

In some embodiments employing plasma including chemical vapor deposition processes, the plasma power density for the low temperature epitaxial deposition process may range from about 2 $mW/cm^2$ to about 2000 $mW/cm^2$. A deposition pressure range may be from about 10 mtorr to about 5 torr.

The above described in situ doping methods may be integrated into the low temperature epitaxial growth processes.

FIG. 4 depicts forming a fourth dielectric spacer layer 40d on the third dielectric spacer layer 40c. The fourth dielectric spacer layer 40d is similar to the third dielectric spacer layer 40c. Therefore, the above description of the third dielectric spacer layer 40c is suitable for describing the fourth dielectric spacer layer 40d. For example, the fourth dielectric spacer 40d can be composed of silicon oxide or silicon nitride. The thickness of the fourth dielectric spacer 40d is selected to cover the lower portion of second source/drain region, i.e., from the apex A1 down. The upper surface of the second source/drain region 25b is not covered by the fourth dielectric spacer layer 40d and remains exposed.

FIG. 4 also depicts forming fin spacers 18 covering the diamond spaced epitaxial material of the second source/drain regions 25b, the fin spacers 18 having an upper surface substantially coplanar with the upper surface of the dielectric cap 17. The fin spacers 16 are formed using a conformal deposition process, such as plasma enhanced chemical vapor deposition (PECVD), following by an anisotropic etchback process, such as reactive ion etch.

FIG. 4 also depicts one embodiment of removing a majority of the material stack including the fourth dielectric spacer layer 40d, the third dielectric spacer layer 40c, and the sacrificial gate structured layer 13 stopping on the second dielectric spacer layer 40b. The etch process may employ the fin spacers 18 and the dielectric cap 17 as an etch mask. In some embodiments, an anisotropic etch, such as reactive ion etch (RIE), that is selective to the fin spacers 18, the dielectric fin cap 17 and the second dielectric spacer layer 40b removes a majority of the fourth dielectric spacer layer 40d, the third dielectric spacer layer 40c, and the sacrificial gate structured layer 13. Due to the anisotropic nature of the etch process, a remaining portion of the fourth dielectric spacer layer 40d, the third dielectric spacer layer 40c, and the sacrificial gate structure layer 13' are present underlying the fin spacers 18.

Figure 5:
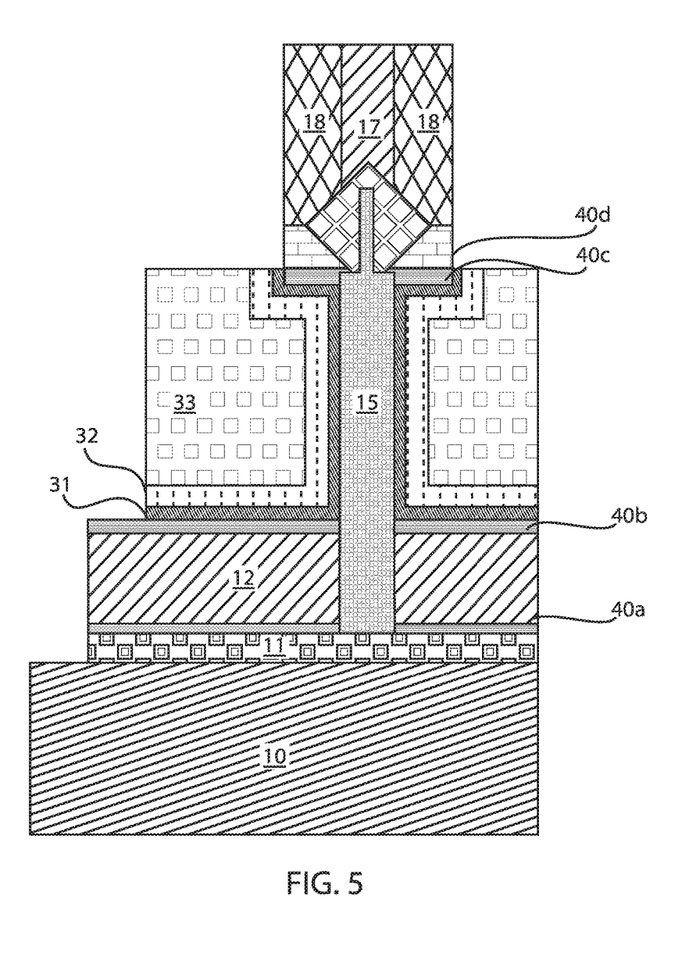
FIG. 5 is a side cross-sectional view depicting forming a gate structure on channel region portion of the fin structure.

FIG. 5 depicts one embodiment of forming a gate structure 30 on channel region portion of the fin structure 15. In some embodiments, the gate structure 30 includes a gate dielectric 31, work function adjusting metal layer 32 and a gate electrode 33.

Figure 8:
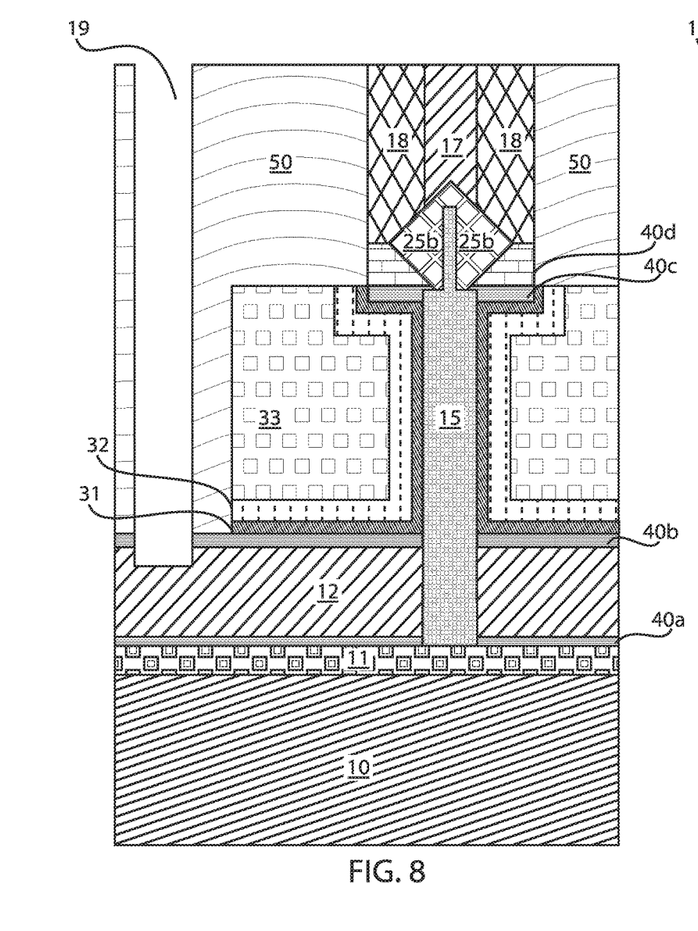
FIG. 8 is side cross-sectional view depicting one embodiment of a via opening to a sacrificial lateral dielectric layer, in accordance with one embodiment of the present disclosure.

In some embodiments, prior to forming the gate dielectric 31, the remaining portion of the fourth dielectric spacer layer 40d, the third dielectric spacer layer 40c, and the sacrificial gate structured layer 13' that is present underlying the fin spacers 15 may be removed using an isotropic selective etch, such as a plasma etch, gas etch or wet etch process. The etch process may also remove the dielectric surface 16 of the sidewall surface of the sacrificial gate layer 14. The etch process may be selective to the fin structure 15. Following the isotropic etch, the sidewalls of the fin structure 15 that provide the channel region of the pass gate transistor 100 are exposed. In the embodiment that is depicted in FIG. 8, the material layer that provides the gate dielectric 31 is blanket deposited atop the entirety of the structure, and is therefore initially present on the exposed surfaces of the fin structure 15, as well as the upper surfaces of the second dielectric spacer 40b, third dielectric spacer 40c and fourth dielectric spacer 40d, the fin spacers 18, and the dielectric fin cap 17. The gate dielectric 31 may be deposited using chemical vapor deposition methods, such as plasma enhanced chemical vapor deposition (PECVD). In other embodiments, the gate dielectric 31 may be deposited using atomic layer deposition (ALD).

Following the formation of the gate dielectric 32, the work function adjusting layer 32 and the gate electrode layer 33 may be deposited. As noted above, each of the work function adjusting layer 32 and the gate electrode layer 33 may be deposited using may be composed of one or more electrically conductive materials, such as metals and electrically conductive semiconductors. The work function adjusting layer 32 may be formed directly on the gate dielectric layer 32, and the gate electrode 33 may be formed directly on the work function adjusting layer 32. The material layers for the gate electrode 32 and/or the work function adjusting layer 32 may be deposited by CVD, e.g., plasma enhanced chemical vapor deposition (PECVD). In other examples, the material layers for the gate electrode 33 and/or the work function adjusting layer 32 may be deposited using physical vapor deposition, such as sputtering. In yet further examples, the material layer for the gate electrode 33 and/or the work function adjusting layer 32 may be deposited using plating, electroplating, electroless deposition, and combinations thereof.

Following deposition of the material layer for the gate electrode 33, an etch process, such as reactive ion etch (RIE), may recess the material layer to the appropriate height. In a following process step, an etch mask may be formed on the recessed material layer for the gate electrode 33, work function adjusting layer 32 and the gate dielectric layer 31 having a pattern selected to provide the geometry of the gate structure 30. The etch mask may be a photoresist mask. Following formation of the etch mask for defining the geometry of the gate structure 80, the exposed portions of the material layer for the gate conductor 32 may be etched to remove the exposed portions of the gate electrode 33, work function adjusting layer 32 and the gate dielectric layer 31. Following the etch process, the etch mask may be removed.

Figure 6:
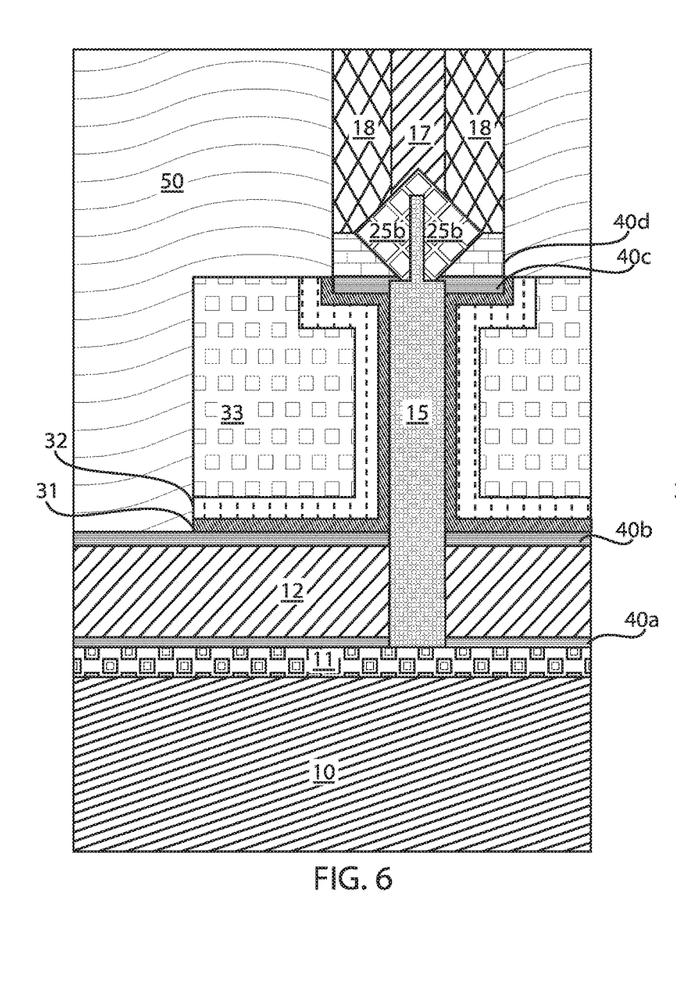
FIG. 6 is a side cross-sectional view depicting forming an interlevel dielectric layer over the structure depicted in FIG. 5.

FIG. 6 depicting forming an interlevel dielectric layer 50 over the structure depicted in FIG. 5. The interlevel dielectric layer 50 may be composed of any dielectric material, such as an oxide, nitride or oyxnitride material. For example, the interlevel dielectric layer 50 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 50 may be deposited using chemical vapor deposition, deposition from solution, spin on deposition and combinations thereof. Following deposition, a planarization process may be applied to the upper surface of the interlevel dielectric layer 50.

Figure 7:
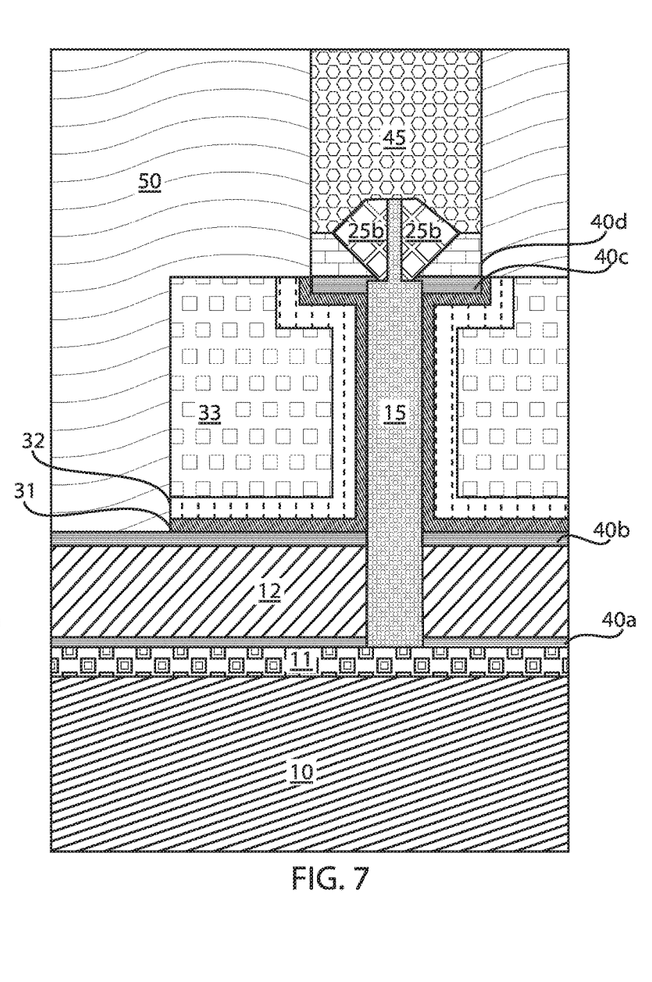
FIG. 7 is a side cross-sectional view depicting forming an epitaxial contact to the second source/drain region.

FIG. 7 depicts forming an epitaxial contact 45 to the second source/drain region 25b. The epitaxial contact 45 is typically composed of epitaxial semiconductor material that is doped to provide electrical conductivity. The dopant concentration of the dopant that provides the conductivity type of the epitaxial contact 45 is present in the base material, e.g., silicon, of the epitaxial contact in an amount greater than the concentration of dopant that dictates the conductivity type of the second source/drain region 25b. Forming the epitaxial contact 45 may begin with removing the sidewall spacers 18 and the dielectric cap 17 using etching that is selective to at least the second source/drain region 25b and the fin structure 15. In some embodiments, the etch may also be selective to the interlevel dielectric 50. Removing the dielectric sidewall spacers 18 and the dielectric cap 17 exposes the semiconductor surfaces of the second source/drain region 25b, which provide a deposition surface for epitaxial growth of the epitaxial contact.

The epitaxial contact 45 may be composed of a type IV or type III-V semiconductor material. The above examples of type IV and type III-V semiconductor materials described above for the semiconductor fin structure 15, and the second source/drain region 25b, are suitable for providing the description of some examples for the composition of the epitaxial contact 45. The epitaxial contact 45 may be formed using an epitaxial deposition process, such as the low temperature epitaxial deposition process that has been described above for forming the second source/drain region 25b.

The epitaxial contact 45 of the pass gate transistor 100 is typically doped to the same conductivity type as the second source/drain region 25b, but the concentration of the n-type or p-type dopant that is present in the material layer for an epitaxial contact 45 is typically greater than the dopant concentration of the n-type or p-type dopant in the second source/drain region 25b. In one example, when the concentration of the n-type or p-type dopant in the second source/drain region 25b ranges from $1\times10^{17}$ atoms/cm$^3$ to $3\times10^{19}$ atoms/cm$^3$, the concentration of the n-type or p-type dopant in the epitaxial contact 45 may range from $1\times10^{19}$ atoms/cm$^3$ to $5\times10^{21}$ atoms/cm$^3$.

Following deposition, the material layer that provides the epitaxial contact 45 may be planarized to have an upper surface coplanar with the upper surface of the interlevel dielectric layer 50.

FIG. 8 depicts one embodiment of forming a via opening 19 through the interlevel dielectric to the sacrificial lateral dielectric layer 12. The via opening 19 that is depicted in FIG. 8 is laterally offset from the portion of the fin structure 15 that the first source/drain region 25a is formed on. The via opening 19 that is depicted in FIG. 8 is also laterally offset to avoid contacting the gate structure 30. The via opening 19 may be formed using photolithography and etch processes. For example, a photoresist mask may be formed exposing the portion of the dielectric material layers in which the via opening is to be formed, wherein following formation of the photoresist mask, the via opening may be etched into the interlevel dielectric 50 using an etch process, such as reactive ion etch. The etch process may extend through the entirety of the interlevel dielectric 50 and the second dielectric spacer layer 40b terminating of the sacrificial dielectric layer 12.

Figure 9:
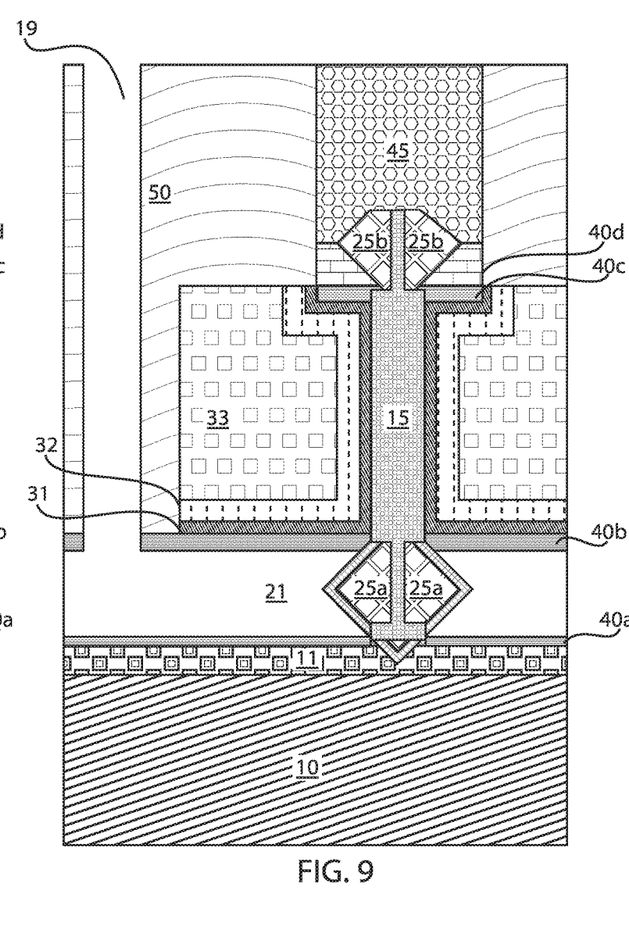
FIG. 9 is a side cross-sectional view depicting removing the sacrificial lateral dielectric layer to provide a laterally extending opening exposing a portion of the fin structure that is opposite the end of the fin structure where the second source/drain region was previously formed; and epitaxially forming the first source/drain region on the exposed portion of the fin structure.

FIG. 9 depicts removing the sacrificial lateral dielectric layer 12 to provide a laterally extending opening exposing a portion of the fin structure 15 that is opposite the end of the fin structure 15 where the second source/drain region 25b was previously formed. The sacrificial lateral dielectric layer 12 may be removed by an etch that is selective to the first dielectric spacer layer 40a, the second dielectric spacer layer 40b and the fin structure 15. The term "selective" denotes that a first material may be etched at a faster rate to a second material. For example, the selective etch rate may remove a first material at a rate greater than 20:1, e.g., greater than 100:1, in comparison to a second material. The etch process for removing the sacrificial dielectric layer 12 is typically an isotropic etch. The term "isotropic" means non-directional. Examples of isotropic etch processes include plasma etching, gas etching or wet etching process. The etch chemistry for removing the sacrificial lateral dielectric layer 12 is introduced through the via opening 19. Removing the sacrificial lateral dielectric layer 12 forms a lateral opening 21 to the portion of the fin structure 15 at which the first source/drain region 25a is to be formed. The lateral opening 21 is connected to the via opening 19 to provide a passageway for the epitaxial source gasses to the fin structure 15 for forming the epitaxial semiconductor material having the diamond geometry for the first source/drain 25a.

FIG. 9 also depicts epitaxially forming the first source/drain region 25a on the portion of the fin structure 15 that is exposed by removing the sacrificial lateral dielectric layer 12. The epitaxial semiconductor material for forming the first source/drain region 25a can be identical in composition and doping concentration as the second source/drain region 25b that is described above. Further, the geometry of the first source/drain region 25a, e.g., diamond geometry, and the size of the first source/drain region 25a can be substantially equal to the geometry and size of the second source/drain region 25b. This provides that the vertically orientated pass gate transistor is symmetrical, e.g., the first and second source/drain regions are substantially identical. Therefore, the above description of the epitaxial formation process for forming the epitaxial material for the second source/drain region 25b is suitable for describing the first source/drain region 25a.

In some embodiments, to facilitate the formation of the epitaxial semiconductor material having the diamond geometry for the first source/drain region 25a having a same size as the epitaxial semiconductor material having the diamond geometry for the second source drain/region 25b, the height H2 of the exposed portion of the fin structure 15 for forming the first source/drain region 25a, 25b is set to be equal to the height H1 of the exposed portion of the fin structure 15 for the second source/drain region 25b. The height H1 of the exposed portion of the fin structure 15 for the second source/drain region 25b is set by the vertical distance between the third dielectric spacer layer 40c and the fin cap 17. This is the portion of the fin structure 15 that extends above the third spacer layer 40c, as depicted in FIG. 3. The height H2 of the exposed portion of the fin structure 15 for the first source/drain region 25a is set by the thickness of the sacrificial lateral dielectric layer 12.

Figure 10:
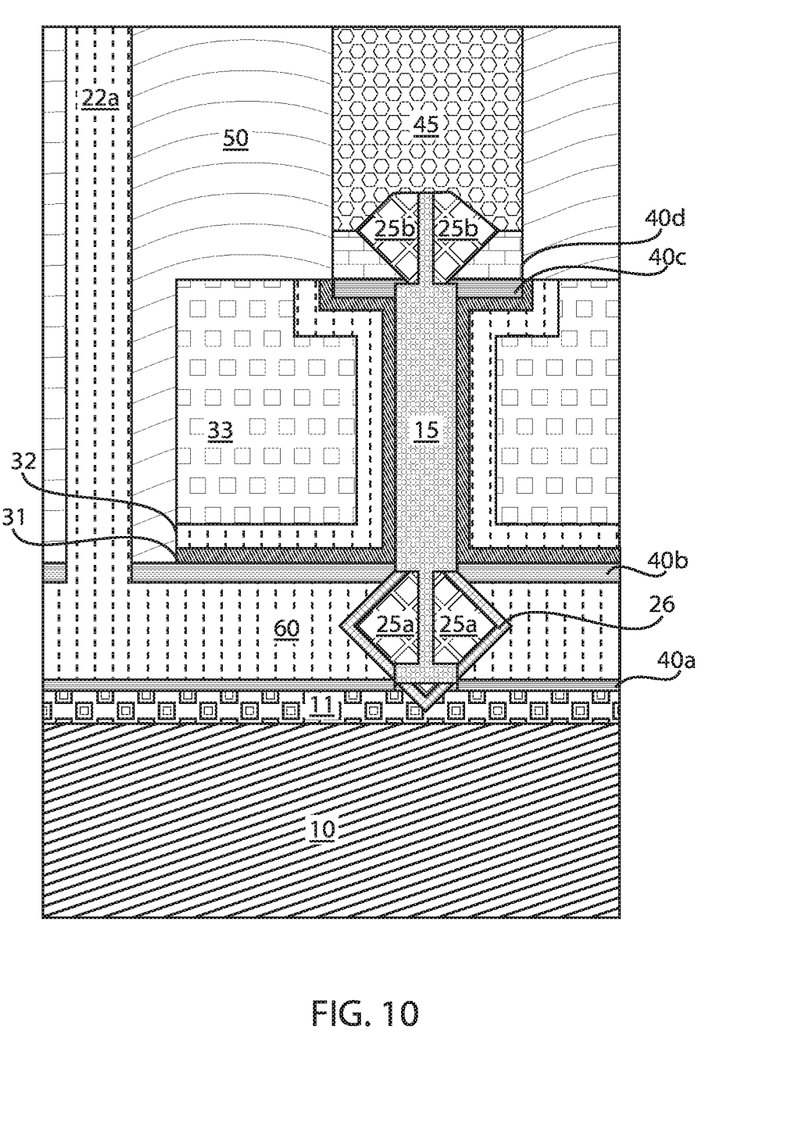
FIG. 10. is side cross-sectional view depicting one embodiment of filling the via opening and the laterally extending opening with an electrically conductive material to provide electrical communication to the first source/drain region.

FIG. 10. depicts one embodiment of filling the via opening 19 and the laterally extending opening 21 with an electrically conductive material to provide electrical communication to the first source/drain region 25a. The via opening may be filled with a metal, such as copper, aluminum, titanium, tungsten, platinum or combinations thereof, to form the via contact 22a and the lateral contact 60. The via contact 22a occupies the via opening, while the lateral contact 60 occupies the laterally extending opening. The electrically conductive material may be deposited into the via opening using physical vapor deposition (PVD). Examples of PVD processes suitable for depositing the metal for the via contact 22a include plating, electroplating, electroless plating, sputtering and combinations thereof. In some embodiments, a metal semiconductor alloy 26 may be formed between the lateral contact 60 and the epitaxial semiconductor material of the first source/drain region 25a. The metal semiconductor alloy, may be a silicide that results from inter-diffusion of semiconductor elements from the first source/drain region 25a and metal elements from the lateral contact. A via contact 22b may be formed to the gate structure, and a via contact 23b may be formed to the second source/drain region 25b as depicted in FIGS. 1A and 1B.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C)

only, or the selection of all three options (A and B and C). This can be extended, as readily apparent by one of ordinary skill in this and related arts, for as many items listed. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a semiconductor device comprising:
    forming a fin structure on a supporting substrate;
    forming a sacrificial lateral dielectric layer on a first portion of the fin structure that provides a first source/drain region portion of the fin structure;
    forming a gate structure atop the sacrificial lateral dielectric layer;
    forming a second epitaxial material having a diamond shaped geometry on an exposed second portion of the fin structure for a second source/drain region;
    removing the sacrificial lateral dielectric layer with an isotropic etch to expose the first portion of the fin structure, wherein removing the sacrificial lateral dielectric layer comprises forming an interlevel dielectric layer on at least the fin structure and the sacrificial lateral dielectric layer; etching an opening through the interlevel dielectric layer to the lateral dielectric layer, and said isotropically etching the sacrificial lateral dielectric layer through the opening; and
    forming a first epitaxial material having the diamond shaped geometry on the first portion of the fin structure that is exposed, wherein a same geometry for the first and second epitaxial material of the first and second source/drain regions provides a symmetrical device.

2. The method of claim 1, wherein the semiconductor device is a vertically orientated pass gate transistor.

3. The method of claim 1, wherein the sacrificial lateral dielectric layer has a thickness that equal to a height of the exposed second portion of the fin structure that the second source/drain region is formed on.

4. The method of claim 1, wherein a composition for the first epitaxial material with the diamond geometry is substantially equal to a composition for the second epitaxial material with the diamond geometry.

5. The method of claim 1, wherein a dopant concentration that dictates a conductivity type of the first epitaxial material with the diamond geometry is substantially equal to dopant concentration that dictates a conductivity type of the second epitaxial material with the diamond geometry.

6. The method of claim 1, wherein the gate structure comprises a gate dielectric, a work function adjusting layer and a gate electrode.

7. The method of claim 1, wherein the fin structure is formed using an epitaxial growth process.

8. The method of claim 1 further comprising forming a contact to the first source/drain region that includes a vertical via portion and a lateral through contact portion.

9. The method of claim 1, wherein each of the first source/drain region and the second source/drain region are formed using epitaxial deposition.

10. The method of claim 1, wherein the first source/drain region is a source region, and the second source/drain region is a drain region.

11. The method of claim 1, wherein the size for the first epitaxial material with the diamond geometry is substantially equal to a size for the second epitaxial material with the diamond geometry.

12. A method of forming a semiconductor device comprising:
    forming a sacrificial lateral dielectric layer on a first portion of a fin structure that provides a first source/drain region portion of the fin structure;
    forming a gate structure atop the sacrificial lateral dielectric layer;
    forming a second epitaxial material having a diamond shaped geometry on an exposed second portion of the fin structure for a second source/drain region;
    removing the sacrificial lateral dielectric layer expose the first portion of the fin structure, wherein removing the sacrificial lateral dielectric layer comprises:
        forming an interlevel dielectric layer encapsulating at least the fin structure and the sacrificial lateral dielectric layer;
        forming a via opening through the interlevel dielectric layer to the lateral dielectric layer, and
        isotropically etching the sacrificial lateral dielectric layer through the via opening to provide a lateral opening in connection with the via opening exposing the portion of the fin structure; and
    forming a first epitaxial material having the diamond shaped geometry on the first portion of the fin structure that is exposed, wherein a same geometry for the first and second epitaxial material of the first and second source/drain regions provides a symmetrical device.

13. The method of claim 12, wherein each of the first source/drain region and the second source/drain region are formed using epitaxial deposition.

14. The method of claim 12, wherein the first source/drain region is a source region, and the second source/drain region is a drain region.

15. The method of claim 12, wherein the a size for the first epitaxial material with the diamond geometry is substantially equal to a size for the second epitaxial material with the diamond geometry.

* * * * *